(12) United States Patent
Dharmalinggam et al.

(10) Patent No.: US 11,664,719 B2
(45) Date of Patent: May 30, 2023

(54) LIGHT LOAD MODE ENTRY OR EXIT FOR POWER CONVERTER

(71) Applicant: Silanna Asia Pte Ltd, Singapore (SG)

(72) Inventors: Rawinder Dharmalinggam, Singapore (SG); Kais Badami, Singapore (SG); Kok Soon Yeo, Singapore (SG)

(73) Assignee: Silanna Asia Pte Ltd, Singapore (SG)

( * ) Notice: Subject to any disclaimer, the term of this patent is extended or adjusted under 35 U.S.C. 154(b) by 149 days.

(21) Appl. No.: 16/983,260

(22) Filed: Aug. 3, 2020

(65) Prior Publication Data

US 2021/0006165 A1 Jan. 7, 2021

Related U.S. Application Data

(63) Continuation of application No. 16/502,843, filed on Jul. 3, 2019, now Pat. No. 10,763,738.

(51) Int. Cl.
*H02M 1/08* (2006.01)
*H02M 3/158* (2006.01)
(Continued)

(52) U.S. Cl.
CPC .......... *H02M 1/083* (2013.01); *G01R 19/175* (2013.01); *H02M 1/08* (2013.01); *H02M 1/088* (2013.01); *H02M 3/158* (2013.01); *H02M 3/1588* (2013.01); *H03K 17/133* (2013.01); *H02M 1/0032* (2021.05); *H02M 1/0058* (2021.05)

(58) Field of Classification Search
CPC .... H02M 1/0032; H02M 1/0058; H02M 1/08; H02M 1/083; H02M 1/088; H02M 1/175; H02M 3/158; H02M 3/1588; G01R 19/175; H03K 17/133

USPC ........ 361/232; 323/222, 232, 235, 282, 284, 323/285
See application file for complete search history.

(56) References Cited

U.S. PATENT DOCUMENTS 5,818,707 A * 10/1998 Seong ................. H02M 1/4225
363/89
9,313,840 B2 4/2016 Grisamore et al.
(Continued)

FOREIGN PATENT DOCUMENTS

JP 2019514330 A 5/2019

OTHER PUBLICATIONS

Office Action dated Dec. 31, 2019 for U.S. Appl. No. 16/502,843.
International Search Report dated Oct. 8, 2020 for PCT Patent Application No. PCT/IB2020/056233.

*Primary Examiner* — Yemane Mehari
(74) *Attorney, Agent, or Firm* — MLO, a professional corp.

(57) ABSTRACT

During a first mode of operation, a zero current detect (ZCD) signal is asserted in response to detecting a zero current condition at a switch node of a power converter. The power converter enters a light load mode of operation when the ZCD signal is asserted between a beginning point and a trigger point of a period of a PWM signal. A compensator voltage is generated based on a feedback voltage indicative of an output voltage. The compensator voltage is compared to a threshold voltage that represents a limit for the compensator voltage during the light load mode of operation determined over a range of the output voltage. The power converter exits the light load mode back to the first mode of operation in response to the compensator voltage being beyond the threshold voltage.

20 Claims, 5 Drawing Sheets

(51) Int. Cl.
  *H02M 1/088* (2006.01)
  *G01R 19/175* (2006.01)
  *H03K 17/13* (2006.01)
  *H02M 1/00* (2006.01)

(56) References Cited

U.S. PATENT DOCUMENTS

| | | | |
|---|---|---|---|
| 9,680,369 B2 * | 6/2017 | Wu | H02M 1/4225 |
| 9,716,435 B2 * | 7/2017 | Radhakrishnan | H02M 1/00 |
| 9,742,302 B2 * | 8/2017 | Xue | H02M 1/083 |
| 9,762,121 B2 * | 9/2017 | Lakkimsetti | H02M 3/158 |
| 2008/0012540 A1 * | 1/2008 | Chen | H02M 1/38 |
| | | | 323/224 |
| 2010/0148737 A1 | 6/2010 | Li et al. | |
| 2010/0201336 A1 | 8/2010 | Chen et al. | |
| 2011/0234190 A1 | 9/2011 | Kenly et al. | |
| 2011/0267015 A1 * | 11/2011 | Lu | H02M 3/1588 |
| | | | 323/235 |
| 2013/0314061 A1 * | 11/2013 | Forghani-zadeh | G05F 1/46 |
| | | | 323/271 |
| 2014/0111168 A1 * | 4/2014 | Chen | H02M 3/1588 |
| | | | 323/235 |
| 2015/0091536 A1 * | 4/2015 | Tanaka | H02M 3/156 |
| | | | 323/235 |
| 2015/0326102 A1 | 11/2015 | Radhakrishnan et al. | |
| 2015/0333611 A1 | 11/2015 | Lakkimsetti et al. | |
| 2016/0172979 A1 | 6/2016 | Xue et al. | |
| 2017/0302178 A1 * | 10/2017 | Bandyopadhyay | H03K 17/284 |

* cited by examiner

| Index | Vin (V) | Vout (V) | DDCM/Dlimit | DDCM = Ton | L (uH) | F (MHz) | Iout (A) | IoBCM (A) | Iout/IoBCM | Dlimit | IrippleBCM (A) | Iripple (A) | GItoV (ohms) | Ramp (V) | VINmax (V) | COMP level (V) | PLAT (V) | COMP level + PLAT (V) |
|---|---|---|---|---|---|---|---|---|---|---|---|---|---|---|---|---|---|---|
| 1 | 22 | 20 | 0.5 | 0.455 | 3 | 1 | 0.076 | 0.303 | 0.25 | 0.909 | 0.606 | 0.303 | 0.1 | 0.5 | 22 | 0.258 | 0.6 | 0.858 |
| 2 | 22 | 19 | 0.5 | 0.432 | 3 | 1 | 0.108 | 0.432 | 0.25 | 0.864 | 0.864 | 0.432 | 0.1 | 0.5 | 22 | 0.259 | 0.6 | 0.859 |
| 3 | 22 | 18 | 0.5 | 0.409 | 3 | 1 | 0.136 | 0.545 | 0.25 | 0.818 | 1.091 | 0.545 | 0.1 | 0.5 | 22 | 0.259 | 0.6 | 0.859 |
| 4 | 22 | 17 | 0.5 | 0.386 | 3 | 1 | 0.161 | 0.644 | 0.25 | 0.773 | 1.288 | 0.644 | 0.1 | 0.5 | 22 | 0.258 | 0.6 | 0.858 |
| 5 | 22 | 16 | 0.5 | 0.364 | 3 | 1 | 0.182 | 0.727 | 0.25 | 0.727 | 1.455 | 0.727 | 0.1 | 0.5 | 22 | 0.255 | 0.6 | 0.855 |
| 6 | 22 | 15 | 0.5 | 0.341 | 3 | 1 | 0.199 | 0.795 | 0.25 | 0.682 | 1.591 | 0.795 | 0.1 | 0.5 | 22 | 0.250 | 0.6 | 0.850 |
| 7 | 22 | 14 | 0.5 | 0.318 | 3 | 1 | 0.212 | 0.848 | 0.25 | 0.636 | 1.697 | 0.848 | 0.1 | 0.5 | 22 | 0.244 | 0.6 | 0.844 |
| 8 | 22 | 13 | 0.5 | 0.295 | 3 | 1 | 0.222 | 0.886 | 0.25 | 0.591 | 1.773 | 0.886 | 0.1 | 0.5 | 22 | 0.236 | 0.6 | 0.836 |
| 9 | 22 | 12 | 0.5 | 0.273 | 3 | 1 | 0.227 | 0.909 | 0.25 | 0.545 | 1.818 | 0.909 | 0.1 | 0.5 | 22 | 0.227 | 0.6 | 0.827 |
| 10 | 22 | 11 | 0.5 | 0.250 | 3 | 1 | 0.229 | 0.917 | 0.25 | 0.500 | 1.833 | 0.917 | 0.1 | 0.5 | 22 | 0.217 | 0.6 | 0.817 |
| 11 | 22 | 10 | 0.5 | 0.227 | 3 | 1 | 0.227 | 0.909 | 0.25 | 0.455 | 1.818 | 0.909 | 0.1 | 0.5 | 22 | 0.205 | 0.6 | 0.805 |
| 12 | 22 | 9 | 0.5 | 0.205 | 3 | 1 | 0.222 | 0.886 | 0.25 | 0.409 | 1.773 | 0.886 | 0.1 | 0.5 | 22 | 0.191 | 0.6 | 0.791 |
| 13 | 22 | 8 | 0.5 | 0.182 | 3 | 1 | 0.212 | 0.848 | 0.25 | 0.364 | 1.697 | 0.848 | 0.1 | 0.5 | 22 | 0.176 | 0.6 | 0.776 |
| 14 | 22 | 7 | 0.5 | 0.159 | 3 | 1 | 0.199 | 0.795 | 0.25 | 0.318 | 1.591 | 0.795 | 0.1 | 0.5 | 22 | 0.159 | 0.6 | 0.759 |
| 15 | 22 | 6 | 0.5 | 0.136 | 3 | 1 | 0.182 | 0.727 | 0.25 | 0.273 | 1.455 | 0.727 | 0.1 | 0.5 | 22 | 0.141 | 0.6 | 0.741 |
| 16 | 22 | 5 | 0.5 | 0.114 | 3 | 1 | 0.161 | 0.644 | 0.25 | 0.227 | 1.288 | 0.644 | 0.1 | 0.5 | 22 | 0.121 | 0.6 | 0.721 |
| | | | | | | | | | | | | | | | Max= | 0.259 | Max= | 0.859 |
| | | | | | | | | | | | | | | | Min= | 0.121 | Min= | 0.721 |

Fig. 5

LIGHT LOAD MODE ENTRY OR EXIT FOR POWER CONVERTER

RELATED APPLICATIONS

This application is a continuation of U.S. patent application Ser. No. 16/502,843 filed Jul. 3, 2019, which is hereby incorporated by reference for all purposes.

BACKGROUND

Various types of power/voltage converters/regulators are used to provide highly regulated voltage and current for powering an electronic load of an overall electronic device. The power converters typically operate within a prescribed range for the output current or power level for one or more input or output voltage levels. Very low levels of output power (i.e., light loads) present distinct operational issues that are generally not problematic or significant at normal, or heavy, loads. Thus, power converters are typically designed to operate in different operating modes, e.g., a light load mode of operation and a heavy load mode of operation. On the other hand, if a power converter were to operate the same during a light load situation as it does during a heavy load situation, then the power converter could experience significant loss of efficiency or reliability. The light load mode of operation, therefore, provides for greater efficiency and/or reliability specifically under light load conditions. Additionally, although very little power is being consumed during light load conditions compared to heavy load conditions, many electronic devices spend a large amount of time in light load conditions. For example, some electronic parts of a cell phone may be in a low power standby mode while in a user's pocket for most of the day, or a computer may draw a very small amount of power to maintain at least a clock when the computer is ostensibly powered off. It is, thus, very important for the power converter to exhibit high power consumption efficiency and operational reliability during light load mode, since the power converter may spend most of its time in this mode. To meet this need, designers of power converters have produced a variety of solutions for low power mode operations, each with different tradeoffs for advantages and disadvantages with respect to complexity, reliability, transient responsiveness, size, and efficiency, among other considerations.

SUMMARY

In accordance with some embodiments, a method includes, during a first mode of operation for a power converter, generating a current at a switch node, the switch node being between a control switch and a synchronous switch in the power converter; asserting a zero current detect (ZCD) signal in response to detecting a zero current condition at the switch node; detecting that the ZCD signal is asserted between a beginning point and a trigger point of a period of a pulse width modulation (PWM) signal, the PWM signal controlling drive signals for driving the control switch and the synchronous switch to generate the current; and entering a light load mode of operation for the power converter in response to the detecting that the ZCD signal is asserted between the beginning point and the trigger point of the period of the PWM signal.

In accordance with some embodiments, a method includes, during a first mode of operation for a power converter, generating a current at a switch node, the switch node being between a control switch and a synchronous switch in the power converter; detecting a light load condition for the power converter; entering a light load mode of operation for the power converter in response to the detecting of the light load condition; generating a compensator voltage based on a feedback voltage and a reference voltage, the feedback voltage being indicative of an output voltage of the power converter, the reference voltage being indicative of a desired voltage level of the output voltage; comparing the compensator voltage to a threshold voltage, the threshold voltage representing a limit for the compensator voltage during the light load mode of operation determined over a range of the output voltage; and exiting from the light load mode of operation to the first mode of operation for the power converter in response to the compensator voltage being beyond the threshold voltage.

In accordance with some embodiments, a power converter includes a control switch, a synchronous switch, a zero current detect (ZCD) comparator, and a light load detector. The control switch and a synchronous switch are electrically connected in series between an input voltage and a ground. A switch node is between the control switch and the synchronous switch. The control switch and the synchronous switch generate a current at the switch node in accordance with drive signals that are controlled by a pulse width modulation (PWM) signal during a first mode of operation for the power converter. The ZCD comparator asserts a ZCD signal in response to a zero current condition at the switch node. The light load detector causes the power converter to enter a light load mode of operation in response to detecting that the ZCD signal is asserted between a beginning point and a trigger point of a period of the PWM signal.

DETAILED DESCRIPTION

Figure 1:
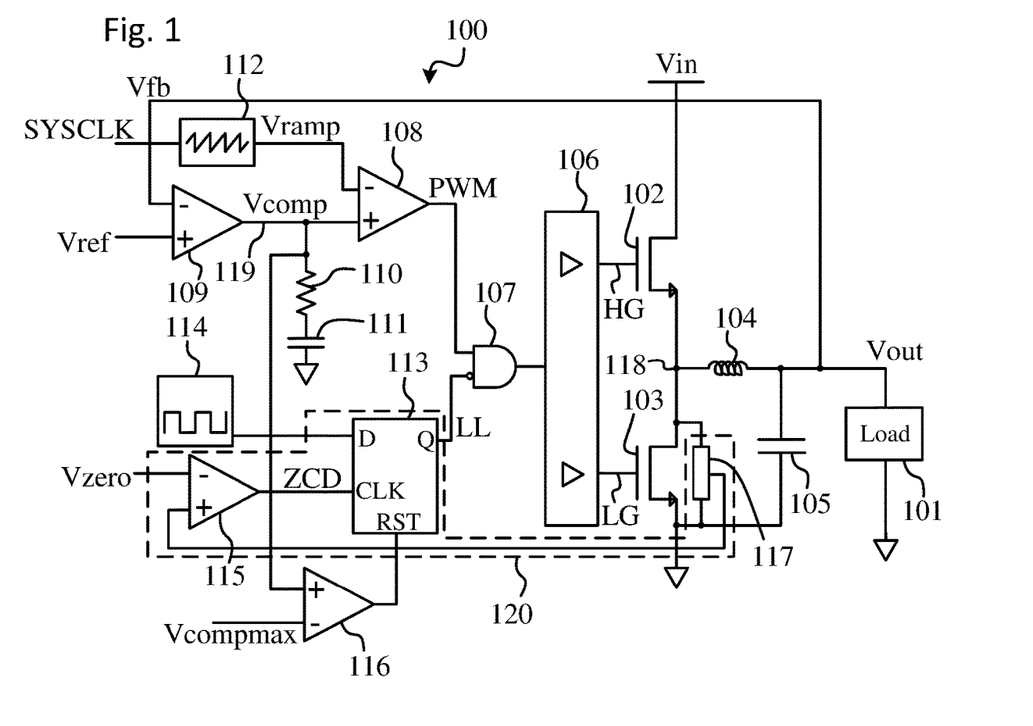
FIG. 1 is a simplified schematic diagram of an example power converter, in accordance with some embodiments.

An example of an improved power converter 100 is shown in FIG. 1, in accordance with some embodiments. In general, the power converter 100 receives an input voltage Vin and produces therefrom an output voltage Vout for powering a load 101 in an overall electronic circuit or device. The design of the power converter 100 generally does not require foreknowledge of the desired voltage level of the output voltage Vout to be generated by the power converter 100 in any given application. Instead, the design of the power converter 100 assumes only a possible range of voltage levels for the output voltage Vout. On the other hand, the designs of some types of conventional power converters generally require such foreknowledge of the desired output voltage to be generated by the conventional power converter, so that feedback from the output voltage can be used to determine when to enter and exit a light load mode or no-load mode or low power operating mode, as opposed to a heavy or normal load mode. The power converter 100, therefore, may have a simpler design than some types of conventional power converters. Additionally, the power converter 100 can be more readily incorporated into an overall electronic device than can some types of conventional power converters, since the desired voltage level of the output voltage Vout does not have to be finally determined by the designers of the device.

In accordance with some embodiments, the power converter 100 generally includes a control switch 102, a synchronous switch 103, an output inductor 104, an output capacitor 105, a drive circuit 106, an AND gate 107, a PWM comparator (PWM signal generator) 108, a feedback error amplifier 109, a frequency compensation resistor 110, a frequency compensation capacitor 111, a voltage ramp signal source 112, a D flipflop 113, a duty cycle clock source 114, a zero current or cross detect (ZCD) comparator 115, a compensation comparator 116, and a current sensor 117, among other components not shown for simplicity. Alternatively, in some embodiments, different components or combinations of components can be used to perform generally the same functions described herein for the components 102-117.

In some embodiments, the control switch 102 and the synchronous switch 103 are MOSFET (metal-oxide-semiconductor field-effect transistor) devices, such as NMOS devices as shown, having a source, a drain, and a gate. The control switch 102 and the synchronous switch 103 are electrically connected in series between an input node (at Vin) and a ground, with the drain of the control switch 102 electrically connected to the input node (at Vin) to receive the input voltage Vin, the source of the synchronous switch 103 electrically connected to the ground, and the source of the control switch 102 electrically connected to the drain of the synchronous switch 103.

The drive circuit 106 is electrically connected to the gates of the control switch 102 and the synchronous switch 103. Thus, the drive circuit 106 is any appropriate electronic circuit which, during the normal (i.e., heavy or first) mode of operation for the power converter 100, generates high side and low side gate drive signals (at HG and LG, respectively) that turn the control switch 102 and the synchronous switch 103 on and off. In general, the synchronous switch 103 is off when the control switch 102 is on, and the control switch 102 is off when the synchronous switch 103 is on, with an appropriate dead time between on/off switching times when both are off to prevent shoot-through current. The alternating on/off operation of the control switch 102 and the synchronous switch 103 generates a switching current and switching voltage at a switch or phase node 118, which is between the source of the control switch 102 and the drain of the synchronous switch 103.

The output inductor 104 has a first node electrically connected to the switch node 118 and a second node electrically connected to an output node (at Vout). The output capacitor 105 has a first node electrically connected to the output node (at Vout) and a second node electrically connected to the ground. Thus, the switching current and switching voltage (generated at the switch node 118) are applied through an output filter (comprising the output inductor 104 and the output capacitor 105) to generate the output voltage Vout (with an output current) to transfer power in a controlled manner from the input node (at Vin) to the output node (at Vout) for powering the load 101.

The drive circuit 106 generates the high side and low side gate drive signals (at HG and LG) in accordance with a pulse width modulation (PWM) signal received through the AND gate 107. The PWM comparator 108 generates the PWM signal in response to a compensator voltage signal Vcomp (received at a positive input of the PWM comparator 108) and a voltage ramp signal Vramp (received at a negative input of the PWM comparator 108). The voltage ramp signal Vramp is a periodic signal (with an added current sense subcomponent) provided or generated by the voltage ramp signal source 112 with a period of that of a system clock SYSCLK, so that the PWM signal and the high side and low side gate drive signals (at HG and LG) have the same period (a switching period) as the system clock SYSCLK. The compensator voltage signal Vcomp (an error voltage) is generated by the feedback error amplifier 109 at a comp node 119 and compensated by a frequency compensator or frequency compensation components (comprising the frequency compensation resistor 110 and the frequency compensation capacitor 111 electrically connected in series from the comp node 119 to the ground).

The feedback error amplifier 109 generates the compensator voltage signal Vcomp based on a feedback voltage signal Vfb (received at a negative input of the feedback error amplifier 109) and a reference voltage signal Vref (received at a positive input of the feedback error amplifier 109). The feedback voltage signal Vfb is (or is based on) the output voltage Vout or is indicative of a voltage level of the output voltage Vout. For example, the feedback voltage signal Vfb may be generated from the output voltage Vout by a voltage divider (not shown). The reference voltage Vref is (or is indicative of) a desired voltage level of the output voltage Vout. Therefore, the compensator voltage signal Vcomp is generated by the feedback error amplifier 109 to be indicative of a level of difference between the feedback voltage signal Vfb and the reference voltage signal Vref and, thus, a level of difference between the output voltage Vout and the desired voltage level of the output voltage Vout. In other words, a lower voltage level of the feedback voltage signal Vfb below the reference voltage signal Vref (i.e., a larger difference therebetween) results in a larger, higher or more positive voltage level of the compensator voltage signal Vcomp; and a higher voltage level of the feedback voltage signal Vfb closer to the reference voltage signal Vref (i.e., a smaller difference therebetween) results in a smaller, lower or more negative voltage level of the compensator voltage signal Vcomp. Additionally, in some embodiments, the compensator voltage signal Vcomp is offset or normalized from zero volts by a plateau or offset voltage amount, and the generation of the voltage ramp signal Vramp takes in to consideration the plateau voltage amount, to ensure that the inputs to the PWM comparator 108 are not zero, since a typical comparator may not operate properly near zero volts.

The PWM comparator 108 asserts the PWM signal high when the compensator voltage signal Vcomp is greater than or higher than the voltage ramp signal Vramp and de-asserts the PWM signal low when the compensator voltage signal Vcomp is less than or lower than the voltage ramp signal Vramp. In general, a higher voltage level of the compensator voltage signal Vcomp results in the compensator voltage signal Vcomp being higher than the voltage ramp signal Vramp for a larger or longer amount of time during the period of the voltage ramp signal Vramp; and a lower voltage level of the compensator voltage signal Vcomp results in the compensator voltage signal Vcomp being higher than the voltage ramp signal Vramp for a smaller or shorter amount of time during the period of the voltage ramp signal Vramp. Therefore, a higher voltage level of the compensator voltage signal Vcomp also results in the PWM signal having a larger duty cycle or being high for a longer portion of its period; and a lower voltage level of the compensator voltage signal Vcomp also results in the PWM signal having a smaller duty cycle or being high for a shorter portion of its period.

In some embodiments, during the high level portion of its period, the PWM signal generally causes the drive circuit 106 to assert the high side gate drive signal at HG to turn on or activate the control switch 102 and to de-assert the low side gate drive signal at LG to turn off or deactivate the synchronous switch 103. The activated control switch 102 (and deactivated synchronous switch 103) generally causes the level of the switching current and switching voltage (generated at the switch node 118) to increase, which causes the level of the output voltage Vout to increase. On the other hand, during the low level portion of its period, the PWM signal generally causes the drive circuit 106 to de-assert the high side gate drive signal at HG to turn off or deactivate the control switch 102 and to assert the low side gate drive signal at LG to turn on or activate the synchronous switch 103. The synchronous switch 103 (and deactivated activated control switch 102) generally causes the level of the switching current and switching voltage (generated at the switch node 118) to decrease, which causes the level of the output voltage Vout to decrease.

Therefore, during the normal mode of operation for the power converter 100, when voltage level of the output voltage Vout increases greater than or higher than the desired voltage level, the difference between the feedback voltage signal Vfb and the reference voltage signal Vref decreases. The voltage level of the compensator voltage signal Vcomp then decreases, so the amount of time that the compensator voltage signal Vcomp is above the voltage ramp signal Vramp decreases, and the duty cycle of the PWM signal decreases. The decreased duty cycle of the PWM signal results in the duration of the high side gate drive signal at HG being shortened and the duration of the low side gate drive signal at LG being lengthened, so that the control switch 102 is turned on for a shorter time, and the synchronous switch 103 is turned on for a longer time, during each switching period. The shorter on-time of the control switch 102 (and longer on-time of the synchronous switch 103) results in the voltage level of the output voltage Vout being decreased back toward the desired voltage level. Thus, a decreased voltage level of the compensator voltage signal Vcomp, when the output voltage Vout is higher than the desired voltage level, causes the voltage level of the output voltage Vout to decrease back toward the desired voltage level.

Additionally, during the normal mode of operation for the power converter 100, when voltage level of the output voltage Vout decreases less than or lower than the desired voltage level, the difference between the feedback voltage signal Vfb and the reference voltage signal Vref increases. The voltage level of the compensator voltage signal Vcomp then increases, so the amount of time that the compensator voltage signal Vcomp is above the voltage ramp signal Vramp increases, and the duty cycle of the PWM signal increases. The increased duty cycle of the PWM signal results in the duration of the high side gate drive signal at HG being lengthened and the duration of the low side gate drive signal at LG being shortened, so that the control switch 102 is turned on for a longer time, and the synchronous switch 103 is turned on for a shorter time, during each switching period. The longer on-time of the control switch 102 (and shorter on-time of the synchronous switch 103) results in the voltage level of the output voltage Vout being increased back toward the desired voltage level. Thus, an increased voltage level of the compensator voltage signal Vcomp, when the output voltage Vout is lower than the desired voltage level, causes the voltage level of the output voltage Vout to increase back toward the desired voltage level.

The ZCD comparator 115 generally detects when the inductor current of the output inductor 104 (i.e., the switching current at 118) is or crosses zero, which indicates operation at a boundary conduction mode (BCM) or in a discontinuous conduction mode (DCM) of the power converter 100. The zero current detection generally involves detecting when the voltage drop across the synchronous switch 103 is positive, i.e., goes from negative to positive. The ZCD comparator 115, thus, receives a voltage signal from the current sensor 117 that is indicative of the inductor current at the switch node 118. The current sensor 117 is any appropriate electronic component (such as a pilot device in parallel with the synchronous switch 103) for measuring the voltage drop across the synchronous switch 103. The voltage signal generated by the current sensor 117 is provided to a positive input of the ZCD comparator 115, and a zero voltage Vzero is provided to a negative input of the ZCD comparator 115. The ZCD comparator 115 generates or outputs a high voltage level for a ZCD signal (i.e., the ZCD signal is asserted or goes high) when the voltage signal generated by the current sensor 117 is above the zero voltage Vzero and outputs a low voltage level for the ZCD signal (i.e., the ZCD signal is de-asserted or goes low) when the voltage signal generated by the current sensor 117 is below the zero voltage Vzero. The ZCD comparator 115 and the current sensor 117, thus, monitor the voltage level at the switch node 118, i.e., the inductor current of the output inductor 104.

The output of the ZCD comparator 115 is electrically connected to a clock input CLK of the D flipflop 113 to provide the ZCD signal thereto. Additionally, the duty cycle clock source 114 is electrically connected to a D input of the D flipflop 113 to provide a duty cycle clock signal thereto, i.e., a clock signal with a specified duty cycle. In some embodiments, the duty cycle clock signal has a 50% duty cycle, or a 50% or less duty cycle, or a 20-50% duty cycle, or a 25-50% duty cycle, or a 30-50% duty cycle, or a 35-50% duty cycle, or a 40-50% duty cycle, or a 45-50% duty cycle. The duty cycle clock signal is synchronized or in phase with, and has the same period as, the system clock SYSCLK and, thus, the PWM signal.

The D flipflop 113 generates a voltage signal at a Q output thereof in response to the voltage levels received at the clock input CLK and the D input. The voltage generated at the Q output is a light load signal LL, which is considered asserted when high and de-asserted when low, in some embodiments. Alternatively, the light load signal LL can be generated at an inverted output, $\overline{Q}$ or Q bar, (not shown), in which case it would be considered asserted when low and de-asserted when high.

The voltage signal at the Q output has a voltage level that is the same as that of the duty cycle clock signal received at the D input when the ZCD signal received at the clock input CLK goes high, i.e., the D flipflop 113 is triggered on a rising edge at the clock input CLK to pass the voltage level at the D input to the Q output. Therefore, if the ZCD signal goes high when the duty cycle clock signal is low, then the D flipflop generates a low voltage at the Q output; and if the ZCD signal goes high when the duty cycle clock signal is high, then the D flipflop generates a high voltage at the Q output.

It has been discovered that it is desirable, or results in improved efficiency, to enter the light load mode of operation for a power converter when the duty cycle of the PWM signal is half of or less than the duty cycle of the PWM signal that occurs during a continuous conduction mode (CCM) or at the BCM. This is achieved in some designs for a conventional power converter by using foreknowledge of the desired voltage level of the output voltage Vout to be generated by the conventional power converter and of the available input voltage Vin. With foreknowledge of the output voltage Vout and the input voltage Vin, it is further known where the compensator voltage signal Vcomp generated by the feedback error amplifier will be in the CCM or at the BCM. The assumption for such a design is that if the compensator voltage signal Vcomp is at half of the level of the compensator voltage signal Vcomp that occurs in the CCM or at the BCM (after normalizing for a plateau voltage amount), then the duty cycle of the PWM signal is half of the duty cycle of the PWM signal that occurs during the CCM or at the BCM. This assumption is slightly crude because it assumes no added current sense ramp during the BCM. Although the added current sense ramp may be relatively low, it is typically not negligible and generally depends on the gain of the current sensor. Nevertheless, it is relatively easy to detect the compensator voltage signal Vcomp, compare it to a voltage level that is half of the known value of the compensator voltage signal Vcomp for the CCM or the BCM, and enter the light load mode when the detected compensator voltage signal Vcomp falls below this voltage level. However, the output voltage Vout might not be known for a power converter, so this technique for entering light load mode might not always be feasible when incorporating the power converter into an overall electronic circuit design.

The above described structure and operation with regard to the D flipflop 113 and the ZCD comparator 115 eliminate the need for foreknowledge of the output voltage Vout by detecting whether the ZCD signal is asserted before a trigger point (e.g., a midpoint or earlier for a 50% or less duty cycle) of the clock period of the duty cycle clock signal, which is also a trigger point of the period of the PWM signal. The D flipflop 113, the ZCD comparator 115, and the current sensor 117, therefore, comprise a light load detector 120 that detects when to cause the power converter to enter the light load mode of operation. For example, it is known that if the ZCD signal is asserted at or before the midpoint (or between a beginning point and the midpoint) of the period of the PWM signal, then the duty cycle of the PWM signal is less than or equal to half of the duty cycle of the PWM signal that occurs during the CCM or at the BCM, which is the point at which it is desirable to enter the light load mode of operation, in some embodiments. On the other hand, if the ZCD signal is asserted after the trigger point (or between the trigger point and an endpoint) of the period of the PWM signal, then the duty cycle of the PWM signal is greater than half of the duty cycle of the PWM signal that occurs during the CCM or at the BCM, so a light load condition is not indicated in some embodiments. In some embodiments, therefore, the duty cycle clock signal has a high voltage during the first portion (e.g., first half or less for a 50% or less duty cycle) of its period and a low voltage during the second portion (e.g., second half or more for a 50% or less duty cycle). Therefore, when the ZCD signal is asserted (i.e., goes high) during the first half or portion of the period of the duty cycle clock signal (i.e., during the first half or portion of the period of the system clock SYSCLK or the PWM signal), then the voltage level generated at the Q output (in response to the ZCD signal and the duty cycle clock signal) will be high, so the light load signal LL will be asserted, and the power converter 100 will enter the light load mode of operation. On the other hand, when the ZCD signal is asserted (i.e., goes high) during the second half or portion of the period of the duty cycle clock signal (i.e., during the second half or portion of the period of the system clock SYSCLK or the PWM signal), then the voltage level generated at the Q output (in response to the ZCD signal and the duty cycle clock signal) will be low, so the light load signal LL will be de-asserted, or not asserted, and the power converter 100 will not enter the light load mode of operation.

The light load signal LL and the PWM signal are provided as inputs to the AND gate 107, and the output of the AND gate 107 is provided as an input to the drive circuit 106. In some embodiments, the input of the light load signal LL is inverted at its input to the AND gate 107. Therefore, when the light load signal LL is de-asserted (voltage low), the AND gate 107 will switch its output in accordance with the PWM signal, thereby passing the PWM signal through to the drive circuit 106, which then toggles the high side and low side gate drive signals (at HG and LG) in accordance with the received PWM signal, as mentioned above. When the light load signal LL is de-asserted (i.e., not in light load mode), therefore, the control switch 102 and the synchronous switch 103 operate in response to the high side and low side gate drive signals (at HG and LG) to generate the switching current and switching voltage (at the switch node 118) in the normal mode of operation. Additionally, when the light load signal LL is asserted (voltage high), the AND gate 107 will output only a low voltage, thereby blocking the PWM signal from passing through to the drive circuit 106, which then de-asserts the high side gate drive signal (at HG) and asserts the low side gate drive signal (at LG). When the light load signal LL is asserted (i.e., in light load mode), therefore, the control switch 102 is held turned off in response to the de-asserted high side gate drive signal (at HG) and the synchronous switch 103 is held turned on in response to the asserted low side gate drive signal (at LG) to allow the switching current and switching voltage (at the switch node 118) to dissipate in the light load mode of operation.

Since the desired output voltage Vout is not necessarily known for the power converter 100, the point at which the light load mode is exited (i.e., the normal mode is entered) cannot be based simply on a known voltage level for the compensator voltage signal Vcomp that depends on the desired output voltage Vout, as may be done in a conventional power converter. Instead, during design of the power converter 100, a range of values for the compensator voltage signal Vcomp is calculated for a range of possible voltage levels for the output voltage Vout. For example, the compensator voltage signal Vcomp can be calculated at several discrete points between a maximum voltage level and a minimum voltage level at which the power converter 100 is designed to produce the output voltage Vout. The largest value of the calculated values for the compensator voltage signal Vcomp is selected as a maximum compensator voltage Vcompmax. The maximum compensator voltage Vcompmax is, thus, an exit threshold voltage representing a limit for the compensator voltage signal Vcomp during the light load mode of operation. The exit threshold voltage can be any value within the power converter 100 that ensures a proper exit from the light load mode of operation. (In accordance with some embodiments, an example process or formula for determining the maximum compensator voltage Vcompmax is described below with respect to FIGS. 3 and 4.)

The maximum compensator voltage Vcompmax is then used to exit the light load mode. The design of the power converter 100 is, thus, optimized for an application in which the output voltage Vout results in the compensator voltage signal Vcomp being at the voltage level of the maximum compensator voltage Vcompmax. For other applications in which the output voltage Vout results in the compensator voltage signal Vcomp being less than the voltage level of the maximum compensator voltage Vcompmax, the power converter 100 may be a little slow or delayed to exit the light load mode, but such performance may be considered acceptable in light of other cost and efficiency benefits of using the power converter 100 in an overall electronic circuit.

The compensation comparator 116 receives the maximum compensator voltage Vcompmax at a negative input and receives the compensator voltage signal Vcomp at a positive input. Thus, the compensation comparator 116 generates a low voltage level (i.e., a reset signal de-asserted) at its output when the compensator voltage signal Vcomp is lower than the maximum compensator voltage Vcompmax and generates a high voltage level (i.e., the reset signal asserted) at its output when the compensator voltage signal Vcomp is greater than the maximum compensator voltage Vcompmax. The output (i.e., the reset signal) of the compensation comparator 116 is provided to a reset input RST of the D flipflop 113.

The D flipflop 113 resets the Q output to a low voltage level whenever the D flipflop 113 receives a high voltage at the reset input RST, thereby de-asserting the light load signal LL and exiting the light load mode. Additionally, when the D flipflop 113 receives a low voltage at the reset input RST, the D flipflop 113 is allowed to operate in accordance with the voltage levels received at the D input and the clock input CLK, as described above for the normal mode, so that the D flipflop 113 can assert the light load signal LL to put the power converter 100 in the light load mode when a light load condition is detected.

As long as the power converter 100 is operating in the normal mode, the compensator voltage signal Vcomp will be lower than the maximum compensator voltage Vcompmax, so the compensation comparator 116 will de-assert the reset signal, and the D flipflop 113 will be allowed to operate in accordance with the voltage levels received at the D input and the clock input CLK, as described above for the normal mode. After entering the light load mode by assertion of the light load signal LL, the compensator voltage signal Vcomp eventually becomes greater than the maximum compensator voltage Vcompmax, triggering the compensation comparator 116 to assert the reset signal, and resetting the D flipflop 113, thereby exiting the light load mode. After exiting the light load mode, the normal mode results in the compensator voltage signal Vcomp eventually becoming lower than the maximum compensator voltage Vcompmax, so that the compensation comparator 116 de-asserts the reset signal, and the D flipflop 113 is again allowed to operate in accordance with the voltage levels received at the D input and the clock input CLK, as described above for the normal mode.

Figure 2:
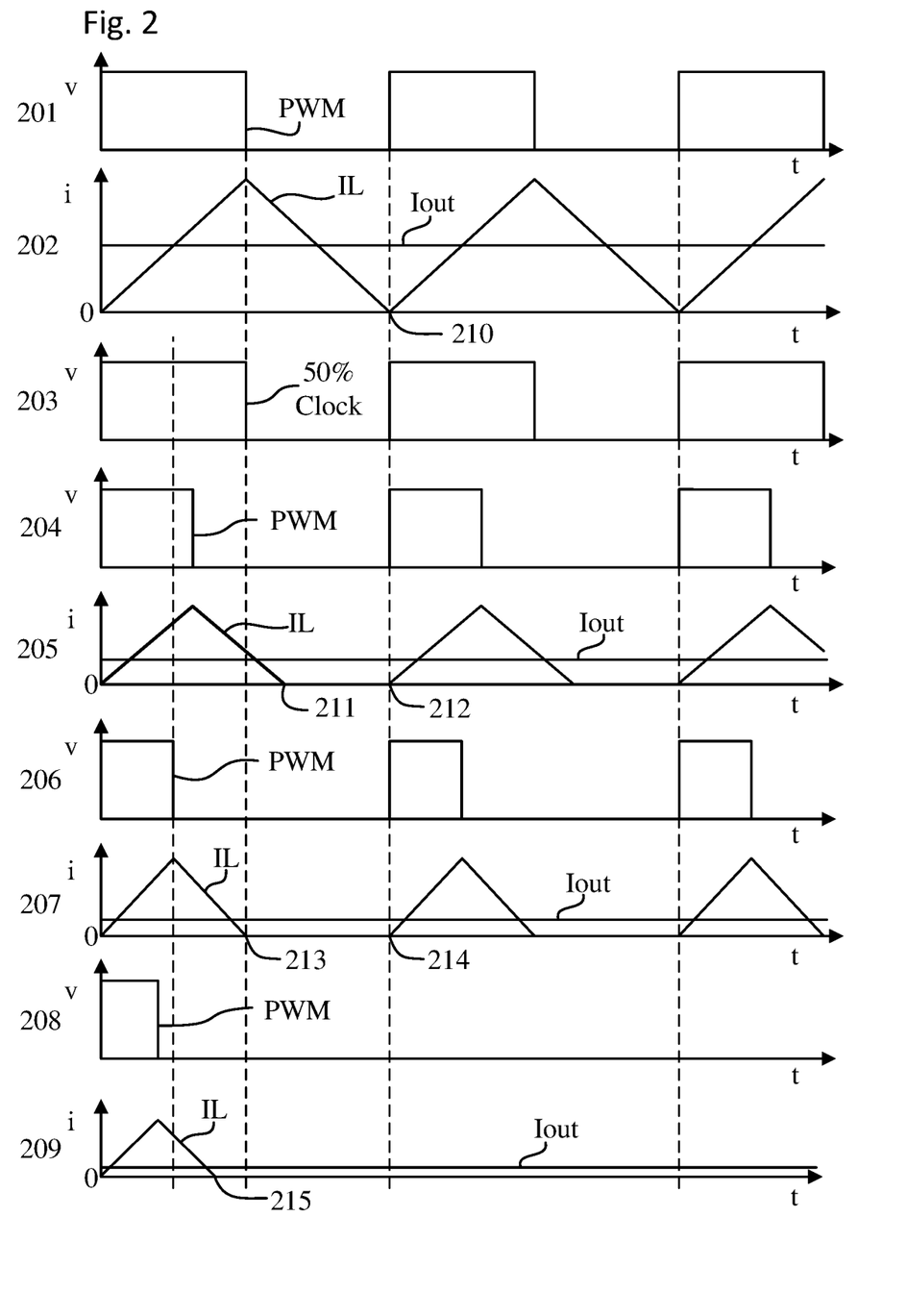
FIG. 2 shows simplified voltage and current timing diagrams illustrating the operation of the example power converter shown in FIG. 1, in accordance with some embodiments.

FIG. 2 shows voltage and current timing diagrams 201-209 illustrating the operation of the power converter 100, in accordance with some embodiments. The voltage and current timing diagrams 201-209 may be simplified or idealized (e.g., without delays or fluctuations) in order to more easily convey the operating concepts.

The voltage timing diagram 201 and the current timing diagram 202 show the PWM signal and the inductor current IL (at 118), respectively, in the CCM or at the BCM. Thus, the inductor current IL drops to zero (e.g., at point 210), but does not remain at zero, so that the output inductor 104 conducts current continuously. Additionally, the PWM signal is at a 50% duty cycle. Also represented is the output current Iout overlaid on the current timing diagram 202.

In the embodiment of this example, the voltage timing diagram 203 shows the duty cycle clock signal with a 50% duty cycle (i.e., a 50% clock). The duty cycle clock signal is synchronized and in phase with, and has the same period as, the PWM signal. Thus, a beginning or rising edge or point of the duty cycle clock signal occurs with a beginning or rising edge or point of the PWM signal, and a trigger point or a midpoint or falling edge of the duty cycle clock signal occurs at a midpoint of the period of the PWM signal. For embodiments in which the duty cycle clock signal has less than a 50% duty cycle, the trigger point or falling edge of the duty cycle clock signal occurs before the midpoint of the period of the PWM signal.

The voltage timing diagram 204 and the current timing diagram 205 show the PWM signal and the inductor current IL (at 118), respectively, when the power converter 100 is in the DCM, i.e., the inductor current IL falls to zero and stays at zero for a period of time (e.g., from point 211 to point 212). Thus, the ZCD comparator 115 is triggered to assert the ZCD signal at the point 211. However, the point 211 is after the trigger point or midpoint or falling edge of the duty cycle clock signal, i.e., during a time when the duty cycle clock signal has a low voltage level. Thus, the D flipflop 113 is not triggered to assert the light load signal LL, so the power converter 100 stays in the normal mode. Also represented is the output current Iout overlaid on the current timing diagram 205, indicating a lower current level than that shown with the current timing diagram 202.

The voltage timing diagram 206 and the current timing diagram 207 show the PWM signal and the inductor current IL (at 118), respectively, when the power converter 100 is in the DCM, i.e., the inductor current IL falls to zero and stays at zero for a period of time (e.g., from point 213 to point 214). Thus, the ZCD comparator 115 is triggered to assert the ZCD signal at the point 213. The point 213 is at the trigger point or midpoint or falling edge of the duty cycle clock signal. Thus, it is optional whether the D flipflop 113 is triggered to assert the light load signal LL. Additionally, the falling edge of the PWM signal in the voltage timing diagram 206 is at a midpoint halfway between the rising edge and falling edge of the PWM signal in the CCM or at the BCM shown in the voltage timing diagram 201. Thus, the duty cycle of the PWM signal in the voltage timing diagram 206 is half of the duty cycle of the PWM signal in the CCM or at the BCM, which is the cutoff point at which to enter the light load mode of operation for the power converter 100 in some embodiments. Also represented is the output current Iout overlaid on the current timing diagram 207, indicating a lower current level than those shown with the current timing diagrams 202 and 205.

The voltage timing diagram 208 and the current timing diagram 209 show the PWM signal and the inductor current IL (at 118), respectively, when the power converter 100 is in the DCM, i.e., the inductor current IL falls to zero and stays at zero for a period of time (e.g., starting at point 215). Thus, the ZCD comparator 115 is triggered to assert the ZCD signal at the point 215. The point 215 is before the trigger point or midpoint or falling edge of the duty cycle clock signal, i.e., during a time when the duty cycle clock signal has a high voltage level. Thus, the D flipflop 113 is triggered to assert the light load signal LL, so the power converter 100 enters the light load mode. Additionally, the falling edge of the PWM signal in the voltage timing diagram 208 is before the midpoint between the rising edge and falling edge of the PWM signal in the CCM or at the BCM shown in the voltage timing diagram 201. Thus, the duty cycle of the PWM signal in the voltage timing diagram 208 is less than half of the duty cycle of the PWM signal in the CCM or at the BCM or less than half of the duty cycle of the duty cycle clock signal, which is the condition within which to enter the light load mode of operation for the power converter 100 in some embodiments. Consequently, the PWM signal in the voltage timing diagram 208 is disabled by the asserted light load signal LL, so there are no subsequent pulses of the PWM signal (and the inductor current IL stays at zero) for controlling the gate drive signals (at HG and LG) for driving the control switch 102 and the synchronous switch 103 until the power converter 100 exits the light load mode. The exit is not shown in the voltage or current timing diagram 208 or 209. Also represented is the output current Iout overlaid on the current timing diagram 209, indicating an even lower current level than those shown with the current timing diagrams 202, 205 and 207.

Figure 3:
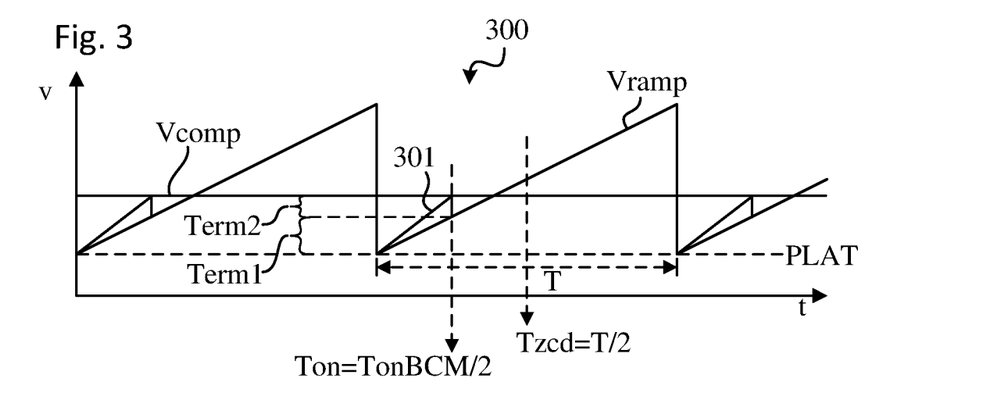
FIG. 3 is a simplified voltage timing diagram illustrating an analysis of the operation of the example power converter shown in FIG. 1, in accordance with some embodiments.

FIG. 3 is a simplified voltage timing diagram 300 of the voltage ramp signal Vramp with the current sense subcomponent 301 illustrating an analysis or formula for calculating the compensator voltage signal Vcomp for the power converter 100 to produce a given output voltage Vout when a time Tzcd at which the ZCD signal is asserted is half (or less) of the total period T of the voltage ramp signal Vramp, e.g., when Tzcd=T/2, in accordance with some embodiments. The on-time (Ton) of the PWM signal (i.e., the on time for the control switch 102) at this point is half (or less) of the on-time (TonBCM) of the PWM signal at the BCM, i.e., Ton=TonBCM/2, since the duty cycle of the PWM signal at this point is half of the duty cycle of the PWM signal at the BCM.

The compensator voltage signal Vcomp at this point is determined by the sum of two terms, Term1 and Term2, plus the plateau voltage amount (PLAT). Thus, the formula or equation for the compensator voltage signal Vcomp is:

$V\text{comp}=\text{Term}1+\text{Term}2+\text{PLAT}.$  Eq. 1

Term1 represents the level of the voltage ramp signal Vramp at Ton=TonBCM/2. Thus, the formula or equation for Term1 is:

$\text{Term}1 = R \times Ton/T,$ Eq. 2 where R is the amplitude of the voltage ramp signal Vramp. Term2 represents the contribution of an inductor current ramping equation given by:

$\text{Term}2 = GItoV \times (Vin - Vout) \times Ton/L,$ Eq. 3 where GItoV is a current sense gain of the synchronous switch 103 and is used to convert a current value into a voltage value, and L is the inductance of the output inductor 104.

Therefore, the calculation of values for the compensator voltage signal Vcomp (used to determine the maximum compensator voltage Vcompmax) is based on the inductance L of the output inductor 104, the current sense gain GItoV of the synchronous switch 103, a frequency of the PWM signal (1/T), the duty cycle of the PWM signal (Ton/T), the amplitude R of the voltage ramp signal Vramp used to generate the PWM signal, the input voltage Vin with which to generate the output voltage Vout, and the output voltage Vout. A range of the compensator voltage signal Vcomp is calculated at several discrete points over a range of the output voltage Vout between a maximum voltage level and a minimum voltage level at which the power converter 100 is designed to produce the output voltage Vout. The largest value of the calculated values for the compensator voltage signal Vcomp is selected as the maximum compensator voltage Vcompmax, which is the minimum voltage level at which it is appropriate to exit the light load mode.

Figure 4:
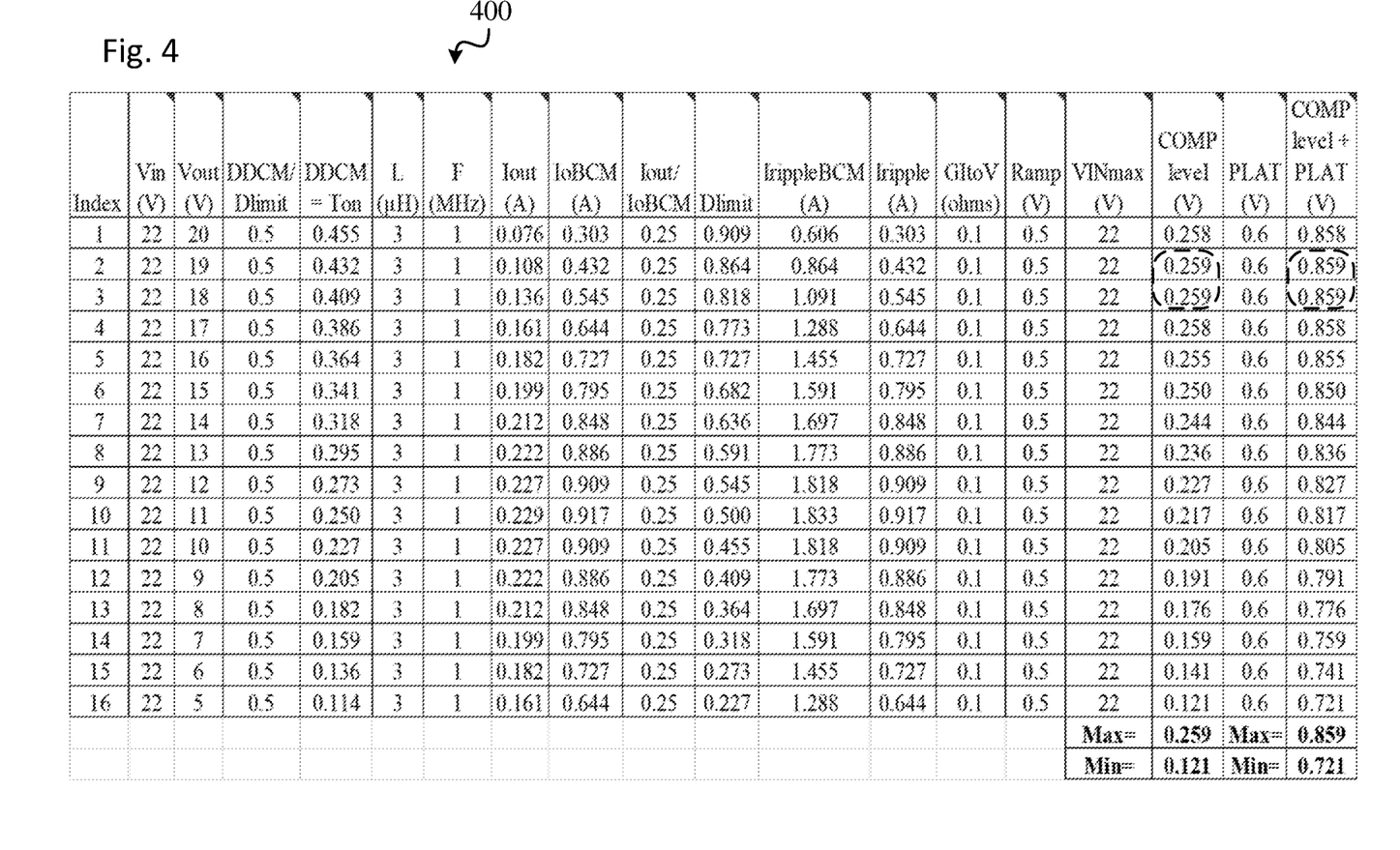
FIG. 4 shows a table illustrating an analysis of the operation of the example power converter shown in FIG. 1, in accordance with some embodiments.

An example of results of this calculation is shown in a table 400 in FIG. 4. For this example, design parameters for the power converter 100 included an input voltage Vin of 22 volts, a maximum input voltage VINmax of 22 volts, an inductance L of the output inductor 104 of 3 µH, a frequency F of the PWM signal of 1 MHz (i.e., a period T of 1 µs), a current sense gain GItoV of the synchronous switch 103 of 0.1 ohms, a ratio of the duty cycle of the PWM signal at DCM (DDCM) to Dlimit (i.e., DDCM/Dlimit) of 0.5, and a plateau voltage amount (PLAT) of 0.6 volts. Additionally, the output voltage Vout was varied in 1-volt steps in a range from 20 volts to 5 volts for each of the following calculations. With these design parameters, the upper limit for the duty cycle (Dlimit) of the PWM signal was calculated as Dlimit=Vout/Vin, the Ton (=DDCM) was calculated as Dlimit×DDCM/Dlimit, the amplitude R of the voltage ramp signal Vramp was calculated as 0.5×Vin/VINmax, the output current Iout was calculated by:

$$Iout = \frac{(Vin - Vout)Ton \times T\left(Ton + \frac{Vin - Vout}{Vout}Ton\right)}{2L},$$  Eq. 4 the output current at BCM (IoBCM) was calculated by:

$$IoBCM = \frac{(Vin - Vout)Dlimit \times T\left(Dlimit + \frac{Vin - Vout}{Vout}Dlimit\right)}{2L},$$  Eq. 5 a ratio of the output current Iout to the output current at BCM (IoBCM) was calculated as Iout/IoBCM, a ripple current at BCM (IrippleBCM) was calculated by:

$$IrippleBCM = \frac{(Vin - Vout)Dlimit \times T}{L}, \text{ and}$$ Eq. 6 a ripple current (Iripple) was calculated as IrippleBCM× DDCM/Dlimit.

With the above design parameters and intermediate calculations, Term2 (Equation 3) was calculated as GItoV× Iripple, and a compensator level (COMP level) was calculated as Term1+Term2. The compensator voltage signal Vcomp was thus calculated as COMP level+PLAT.

Over the range of the output voltage Vout, the largest or maximum value for the compensator COMP level was determined to be 0.259 volts, and the largest or maximum value for the compensator voltage signal Vcomp was determined to be 0.859 volts, which occurred at 18 and 19 volts for the output voltage Vout. Thus, the maximum compensator voltage Vcompmax for an example implementation of the power converter 100 having the above described design parameters was 0.859 volts.

Additionally, the smallest or minimum value for the compensator COMP level was determined to be 0.121 volts, and the smallest or minimum value for the compensator voltage signal Vcomp was determined to be 0.721 volts, which occurred at 5 volts for the output voltage Vout. The range of calculated values for the compensator voltage signal Vcomp was, thus, 0.859-0.721 volts. Therefore, for applications of the power converter 100 that do not produce the output voltage Vout at about 18 or 19 volts, the exit from the light load mode may not occur at the best or optimal value for the compensator voltage signal Vcomp. As a result, the light load exit performance may be slightly delayed or sluggish. Further analysis or simulation of an example of the power converter 100 at any desired value for the output voltage Vout can reveal whether this delay or sluggishness is significant, has any noticeable consequences, or is a problem in any way. Such performance may be acceptable to the designer of the overall electronic device if cost, size and/or efficiency requirements are met.

Figure 5:
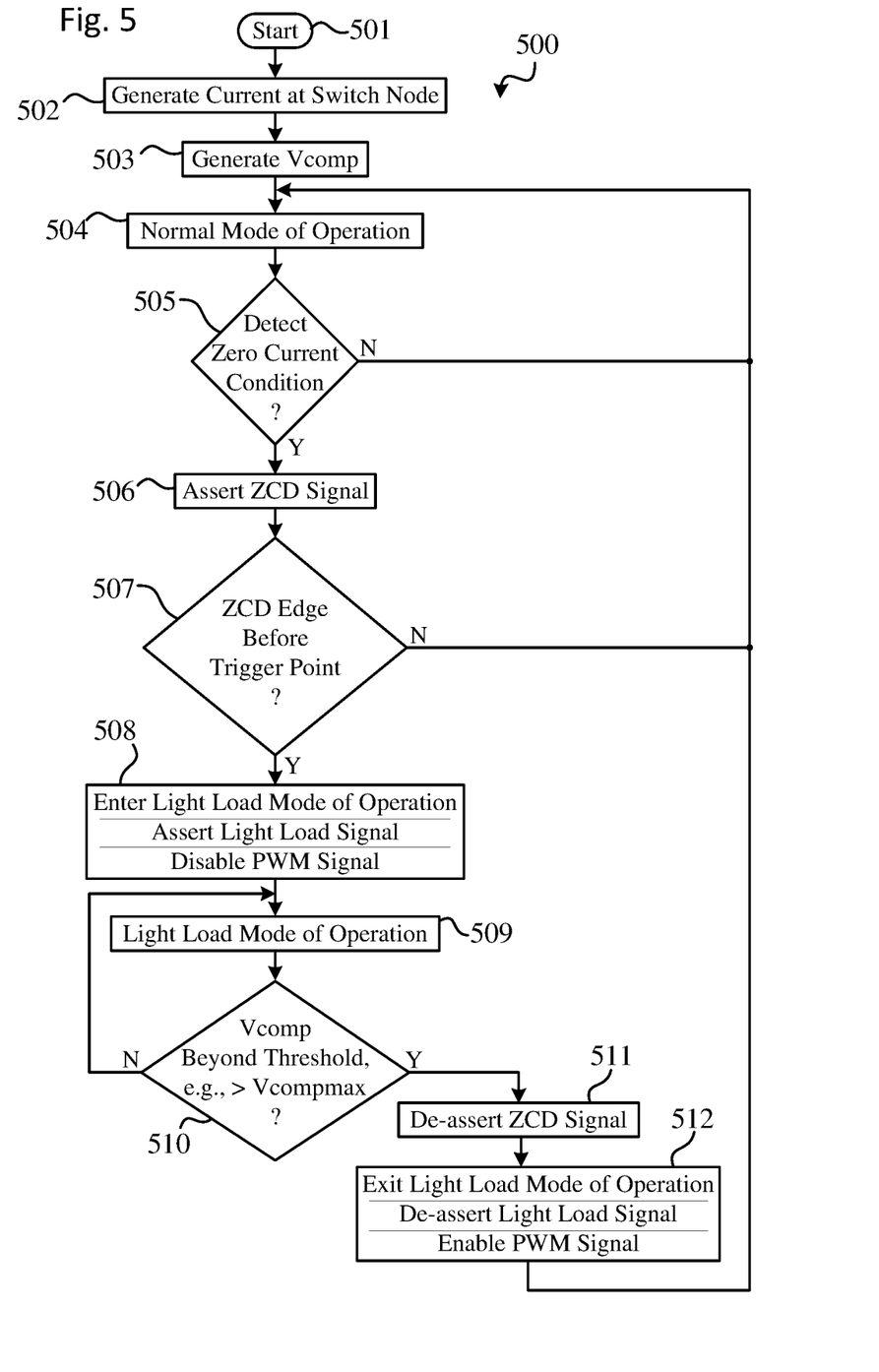
FIG. 5 shows a simplified flowchart illustrating the operation of the example power converter shown in FIG. 1, in accordance with some embodiments.

A simplified flowchart of a process 500 illustrating an example operation of the power converter 100 is shown in FIG. 5, in accordance with some embodiments. The particular steps, combination of steps, and order of the steps of the process 500 are provided for illustrative purposes only. Other processes with different steps, combinations of steps, or orders of steps can also be used to achieve the same or similar result. Features or functions described for one of the steps performed by one of the components may be enabled in a different step or component in some embodiments.

After the power converter 100 has started (at 501), the control switch 102 and the synchronous switch 103 generate (at 502) the inductor current IL at the switch node 118, and the feedback error amplifier 109 generates (at 503, and continuously throughout the process 500) the compensator voltage signal Vcomp (based on the feedback voltage signal Vfb and the reference voltage signal Vref), so that the power converter 100 thereby operates (at 504) in the normal mode of operation. When the ZCD comparator 115 detects (at 505) a zero current condition at the switch node 118, the ZCD comparator 115 asserts (at 506) the ZCD signal. If the ZCD comparator 115 does not detect (at 505) a zero current condition, then operation generally continues in the normal mode (at 504).

After asserting (at 506) the ZCD signal, the operation of the D flipflop 113 detects (at 507) whether the ZCD signal is asserted (e.g., a rising edge of the ZCD signal occurs) between a beginning point and a trigger point or midpoint of a period of the PWM signal or before the trigger point or midpoint or falling edge of the duty cycle clock signal (e.g., 50% clock midpoint edge or trigger point edge for a 50% duty cycle), i.e., while the duty cycle clock signal is in a high state. If the detection at 507 is positive, then the power converter 100 enters (at 508) the light load mode of operation by the D flipflop 113 asserting the light load signal LL, and thereby disabling the PWM signal through the AND gate 107 from controlling the gate drive signals (at HG and LG). The power converter 100 then operates (at 509) in the light load mode of operation. On the other hand, if the detection at 507 is negative, i.e., when the assertion or rising edge of the ZCD signal occurs after the trigger point or midpoint or falling edge of the duty cycle clock signal and while the clock duty cycle signal is in a low state, then the D flipflop 113 de-asserts or does not assert the light load signal LL, and operation generally continues without interruption in the normal mode (at 504).

In the light load mode of operation (and continuously throughout the process 500), the compensation comparator 116 compares the compensator voltage signal Vcomp to the maximum compensator voltage Vcompmax, i.e., the exit threshold voltage. Thus, the compensation comparator 116 detects (at 510) whether the compensator voltage signal Vcomp is beyond (e.g., greater than) the maximum compensator voltage Vcompmax. If so, then the ZCD comparator 115 will have de-asserted (at 511) the ZCD signal already, so in response to the detection at 510 being positive, the output of the compensation comparator 116 can cause the power converter 100 to exit (at 512) the light load mode of operation by resetting the D flipflop 113 to de-assert the light load signal LL, thereby enabling the PWM signal through the AND gate 107. In this case, operation generally resumes in the normal mode (at 504). On the other hand, if the detection at 510 is negative, then operation generally continues in the light load mode of operation (at 509) until the detection at 510 becomes positive.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method comprising:
asserting a zero current detect (ZCD) signal in response to detecting a zero current condition at a switch node of a power converter during a first mode of operation;
detecting that the ZCD signal is asserted between a beginning point and a trigger point of a period of a pulse width modulation (PWM) signal; and
entering a light load mode of operation for the power converter in response to the detecting that the ZCD signal is asserted between the beginning point and the trigger point of the period of the PWM signal.

2. The method of claim 1, further comprising:
generating a compensator voltage based on a feedback voltage and a reference voltage, the feedback voltage being indicative of an output voltage of the power converter, the reference voltage being indicative of a desired voltage level of the output voltage;
comparing the compensator voltage to a threshold voltage, the threshold voltage representing a limit for the compensator voltage during the light load mode of operation based on an inductance of an output inductor, a current sense gain of a synchronous switch of the power converter, a frequency of the PWM signal, a duty cycle of the PWM signal, an amplitude of a voltage ramp signal used to generate the PWM signal, an input voltage with which to generate the output voltage, and a range of the output voltage; and exiting from the light load mode of operation to the first mode of operation for the power converter in response to the compensator voltage being beyond the threshold voltage.

3. The method of claim 1, further comprising:
generating a compensator voltage based on a feedback voltage and a reference voltage, the feedback voltage being indicative of an output voltage of the power converter, the reference voltage being indicative of a desired voltage level of the output voltage;
comparing the compensator voltage to a threshold voltage, the threshold voltage representing a maximum value for the compensator voltage during the light load mode of operation based on an inductance of an output inductor, a current sense gain of a synchronous switch of the power converter, a frequency of the PWM signal, a duty cycle of the PWM signal, an amplitude of a voltage ramp signal used to generate the PWM signal, an input voltage with which to generate the output voltage, and a range of the output voltage; and
exiting from the light load mode of operation to the first mode of operation for the power converter in response to the compensator voltage being greater than the threshold voltage.

4. The method of claim 1, further comprising:
providing a clock signal having a 50% duty cycle, the clock signal being in phase with the PWM signal, the clock signal having a clock period that is the same as the period of the PWM signal, and the clock signal having a midpoint edge at a midpoint of the clock period;
and wherein:
the detecting that the ZCD signal is asserted between the beginning point and the trigger point of the period of the PWM signal further comprises detecting that the asserting of the ZCD signal occurs before the midpoint edge of the clock signal.

5. The method of claim 4, further comprising:
providing the ZCD signal to a clock input of a D flipflop;
providing the clock signal to a D input of the D flipflop, the midpoint edge of the clock signal being a falling edge;
when a rising edge of the ZCD signal occurs before the falling edge of the clock signal and while the clock signal is in a high state, the D flipflop asserting a light load signal, which indicates that the ZCD signal is asserted between the beginning point and the trigger point of the period of the PWM signal; and
when the rising edge of the ZCD signal occurs after the falling edge of the clock signal and while the clock signal is in a low state, the D flipflop de-asserting the light load signal.

6. The method of claim 5, further comprising:
the de-asserted light load signal enabling the PWM signal for controlling drive signals for driving a control switch of the power converter and a synchronous switch of the power converter to generate a current at the switch node; and
the asserted light load signal disabling the PWM signal from controlling the drive signals for driving the control switch and the synchronous switch to generate the current.

7. The method of claim 6, further comprising:
generating a compensator voltage based on a feedback voltage and a reference voltage, the feedback voltage being indicative of an output voltage of the power converter, the reference voltage being indicative of a desired voltage level of the output voltage;
comparing the compensator voltage to a threshold voltage, the threshold voltage representing a maximum value for the compensator voltage during the light load mode of operation based on an inductance of an output inductor, a current sense gain of the synchronous switch, a frequency of the PWM signal, a duty cycle of the PWM signal, an amplitude of a voltage ramp signal used to generate the PWM signal, an input voltage with which to generate the output voltage, and a range of the output voltage;
asserting a comparator signal in response to the compensator voltage being greater than the threshold voltage;
de-asserting the comparator signal in response to the compensator voltage being less than the threshold voltage;
providing the comparator signal to a reset input of the D flipflop; and
the D flipflop de-asserting the light load signal in response to the asserted comparator signal;
and wherein:
the D flipflop does not alter the asserting and de-asserting of the light load signal in response to the de-asserted comparator signal.

8. A power converter comprising:
a light load detector that causes the power converter to enter a light load mode of operation in response to detecting a light load condition for the power converter;
an error amplifier that generates a compensator voltage based on a feedback voltage and a reference voltage, the feedback voltage being indicative of an output voltage of the power converter, the reference voltage being indicative of a desired voltage level of the output voltage; and
a compensation comparator that causes the power converter to exit from the light load mode of operation to a first mode of operation for the power converter in response to the compensator voltage being beyond a threshold voltage, the threshold voltage representing a limit for the compensator voltage during the light load mode of operation determined over a range of the output voltage.

9. The power converter of claim 8, further comprising:
a control switch and a synchronous switch electrically connected in series between an input voltage and a ground, the control switch and the synchronous switch generating a current at a switch node therebetween;
and wherein:
the limit for the compensator voltage during the light load mode of operation is based on an inductance of an output inductor, a current sense gain of the synchronous switch, a frequency of a pulse width modulation (PWM) signal, a duty cycle of the PWM signal, an amplitude of a voltage ramp signal used to generate the PWM signal, the input voltage with which to generate the output voltage, and the range of the output voltage; and
the PWM signal controls drive signals for driving the control switch and the synchronous switch to generate the current.

10. The power converter of claim 8, wherein:
the limit for the compensator voltage during the light load mode of operation is a maximum value for the compensator voltage during the light load mode of operation; and the compensation comparator causes the power converter to exit from the light load mode of operation to the first mode of operation for the power converter in response to the compensator voltage being greater than the threshold voltage.

11. The power converter of claim 8, further comprising:
a control switch and a synchronous switch electrically connected in series between an input voltage and a ground, the control switch and the synchronous switch generating a current at a switch node therebetween;
and wherein:
the light load detector detects the light load condition by detecting that a zero current detect (ZCD) signal is asserted between a beginning point and a trigger point of a period of a pulse width modulation (PWM) signal, the PWM signal controlling drive signals for driving the control switch and the synchronous switch to generate the current, and the ZCD signal indicating a zero current condition at the switch node; and
the light load detector causes the power converter to enter the light load mode of operation in response to the detecting of the ZCD signal being asserted between the beginning point and the trigger point of the period of the PWM signal.

12. The power converter of claim 11, further comprising:
a D flipflop having a clock input and a D input;
and wherein:
the ZCD signal is provided to the clock input of the D flipflop, the ZCD signal being asserted on a rising edge thereof;
a clock signal is provided to the D input of the D flipflop, the clock signal having a 50% duty cycle, the clock signal being in phase with the PWM signal, the clock signal having a clock period that is the same as the period of the PWM signal, and the clock signal having a falling edge at a trigger point of the clock period;
when the rising edge of the ZCD signal occurs before the falling edge of the clock signal and while the clock signal is in a high state, the D flipflop asserts a light load signal, which indicates that the ZCD signal is asserted between the beginning point and the trigger point of the period of the PWM signal;
when the rising edge of the ZCD signal occurs after the falling edge of the clock signal and while the clock signal is in a low state, the D flipflop de-asserts the light load signal;
the asserted light load signal disables the PWM signal from controlling the drive signals for driving the control switch and the synchronous switch to generate the current; and
the de-asserted light load signal enables the PWM signal for controlling the drive signals for driving the control switch and the synchronous switch to generate the current.

13. A power converter comprising:
a zero current detect (ZCD) comparator that asserts a ZCD signal in response to a zero current condition at a switch node of the power converter during a first mode of operation; and
a light load detector that causes the power converter to enter a light load mode of operation in response to detecting that the ZCD signal is asserted between a beginning point and a trigger point of a period of a pulse width modulation (PWM) signal.

14. The power converter of claim 13, further comprising:
a control switch and a synchronous switch electrically connected in series between an input voltage and a ground, the control switch and the synchronous switch generating a current at the switch node therebetween;
an error amplifier that generates a compensator voltage based on a feedback voltage and a reference voltage, the feedback voltage being indicative of an output voltage of the power converter, the reference voltage being indicative of a desired voltage level of the output voltage; and
a compensation comparator that causes the power converter to exit from the light load mode of operation to the first mode of operation in response to the compensator voltage being beyond a threshold voltage, the threshold voltage representing a limit for the compensator voltage during the light load mode of operation based on an inductance of an output inductor, a current sense gain of the synchronous switch, a frequency of the PWM signal, a duty cycle of the PWM signal, an amplitude of a voltage ramp signal used to generate the PWM signal, the input voltage, and a range of the output voltage.

15. The power converter of claim 13, further comprising:
a control switch and a synchronous switch electrically connected in series between an input voltage and a ground, the control switch and the synchronous switch generating a current at the switch node therebetween;
an error amplifier that generates a compensator voltage based on a feedback voltage and a reference voltage, the feedback voltage being indicative of an output voltage of the power converter, the reference voltage being indicative of a desired voltage level of the output voltage; and
a compensation comparator that causes the power converter to exit from the light load mode of operation to the first mode of operation in response to the compensator voltage being greater than a threshold voltage, the threshold voltage representing a maximum value for the compensator voltage during the light load mode of operation based on an inductance of an output inductor, a current sense gain of the synchronous switch, a frequency of the PWM signal, a duty cycle of the PWM signal, an amplitude of a voltage ramp signal used to generate the PWM signal, the input voltage, and a range of the output voltage.

16. The power converter of claim 13, wherein:
detecting that the ZCD signal is asserted between the beginning point and the trigger point of the period of the PWM signal further comprises detecting that the asserting of the ZCD signal occurs before a trigger point edge of a clock signal;
the clock signal has a 50% duty cycle;
the clock signal is in phase with the PWM signal;
the clock signal has a clock period that is the same as the period of the PWM signal; and
the trigger point edge of the clock signal is at a midpoint of the clock period.

17. The power converter of claim 16, wherein:
the light load detector comprises a D flipflop having a D input electrically connected to receive the clock signal and a clock input electrically connected to receive the ZCD signal;
the trigger point edge of the clock signal is a falling edge;
when a rising edge of the ZCD signal occurs before the falling edge of the clock signal and while the clock signal is in a high state, the D flipflop asserts a light load signal, which indicates that the ZCD signal is asserted between the beginning point and the trigger point of the period of the PWM signal; and when the rising edge of the ZCD signal occurs after the falling edge of the clock signal and while the clock signal is in a low state, the D flipflop de-asserts the light load signal.

18. The power converter of claim 17, further comprising:
a control switch and a synchronous switch electrically connected in series between an input voltage and a ground, the control switch and the synchronous switch generating a current at the switch node therebetween;
and wherein:
the asserted light load signal disables the PWM signal from controlling drive signals for driving the control switch and the synchronous switch to generate the current; and
the de-asserted light load signal enables the PWM signal for controlling the drive signals for driving the control switch and the synchronous switch to generate the current.

19. The power converter of claim 17, further comprising:
an error amplifier that generates a compensator voltage based on a feedback voltage and a reference voltage, the feedback voltage being indicative of an output voltage of the power converter, the reference voltage being indicative of a desired voltage level of the output voltage;
a compensation comparator electrically connected to receive the compensator voltage and a threshold voltage, the threshold voltage representing a maximum value for the compensator voltage during the light load mode of operation;
and wherein:
the compensation comparator asserts a comparator signal in response to the compensator voltage being greater than the threshold voltage;
the compensation comparator de-asserts the comparator signal in response to the compensator voltage being less than the threshold voltage;
the D flipflop has a reset input electrically connected to receive the comparator signal;
the D flipflop de-asserts the light load signal in response to the asserted comparator signal; and
the D flipflop does not alter the asserting and de-asserting of the light load signal in response to the de-asserted comparator signal.

20. The power converter of claim 13, further comprising:
an output inductor electrically connected to the switch node;
and wherein:
a current at the switch node flows through the output inductor; and
the zero current condition results from the current through the output inductor being zero.

* * * * *